(12) United States Patent
Kikuchi

(10) Patent No.: US 6,266,383 B1
(45) Date of Patent: *Jul. 24, 2001

(54) CLOCK REPRODUCTION CIRCUIT AND DATA TRANSMISSION APPARATUS

(75) Inventor: Hidekazu Kikuchi, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/184,974

(22) Filed: Nov. 3, 1998

(51) Int. Cl.$^7$ .................................................. H04L 7/00
(52) U.S. Cl. ......................... 375/358; 375/362; 375/375; 370/503; 370/518
(58) Field of Search .................................... 375/357, 358, 375/362, 375, 376; 370/503, 516, 517, 518; 713/400; 714/798

(56) References Cited

U.S. PATENT DOCUMENTS

| | | | |
|---|---|---|---|
| 4,110,558 | * | 8/1978 | Kageyama et al. ............... 178/69.1 |
| 4,926,447 | * | 5/1990 | Corsetto et al. ..................... 375/120 |
| 5,068,628 | * | 11/1991 | Ghoshal ................................ 331/1 A |
| 5,260,979 | * | 11/1993 | Parker et al. ........................ 375/108 |
| 6,069,927 | * | 5/2000 | Kikuchi ............................... 375/357 |

* cited by examiner

Primary Examiner—Stephen Chin
Assistant Examiner—Dac V. Ha
(74) Attorney, Agent, or Firm—Ronald P. Kananen; Rader, Fishman & Grauer

(57) ABSTRACT

A clock reproduction circuit capable of accurately reproducing a clock with a simple circuit structure and a data transmission apparatus capable of handling a wide range of transfer rates, having a reproduced clock signal which can quickly track a transmission clock, and not requiring an increase of the transmission media, wherein provision is made of a reception unit (clock reproduction circuit) having a clock generation circuit for generating a clock signal based on transmission data when a switch signal is not input and generating a clock signal locked to a frequency of a reference clock signal based on the reference clock signal when a switch signal is input; and an error detection circuit for defining a difference of input data sampled at a plurality of points having different phases of the clock signal generated at the clock generation circuit as an error, detecting whether the related error is a chance error or an error due to a deviation of the frequency between the generated clock signal and the input data and outputting the switch signal to the clock generation circuit in the case of frequency deviation error.

22 Claims, 5 Drawing Sheets

FIG. 1
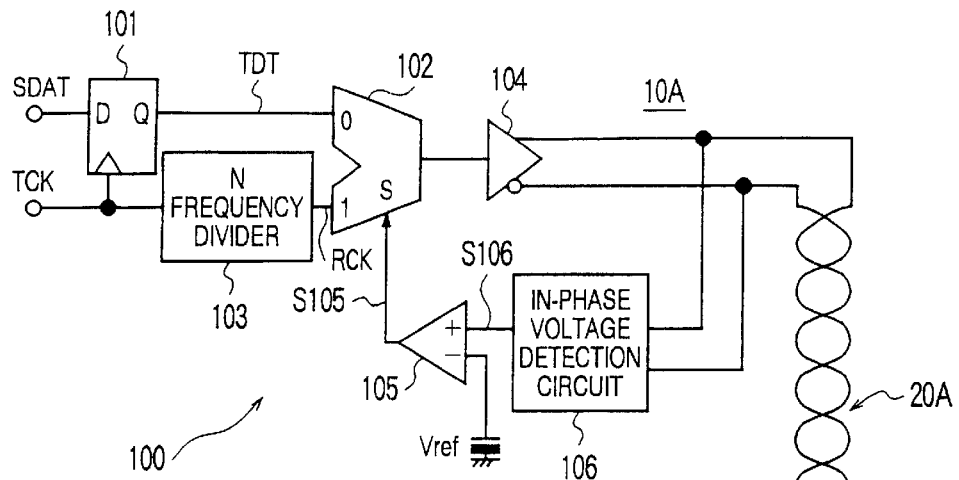
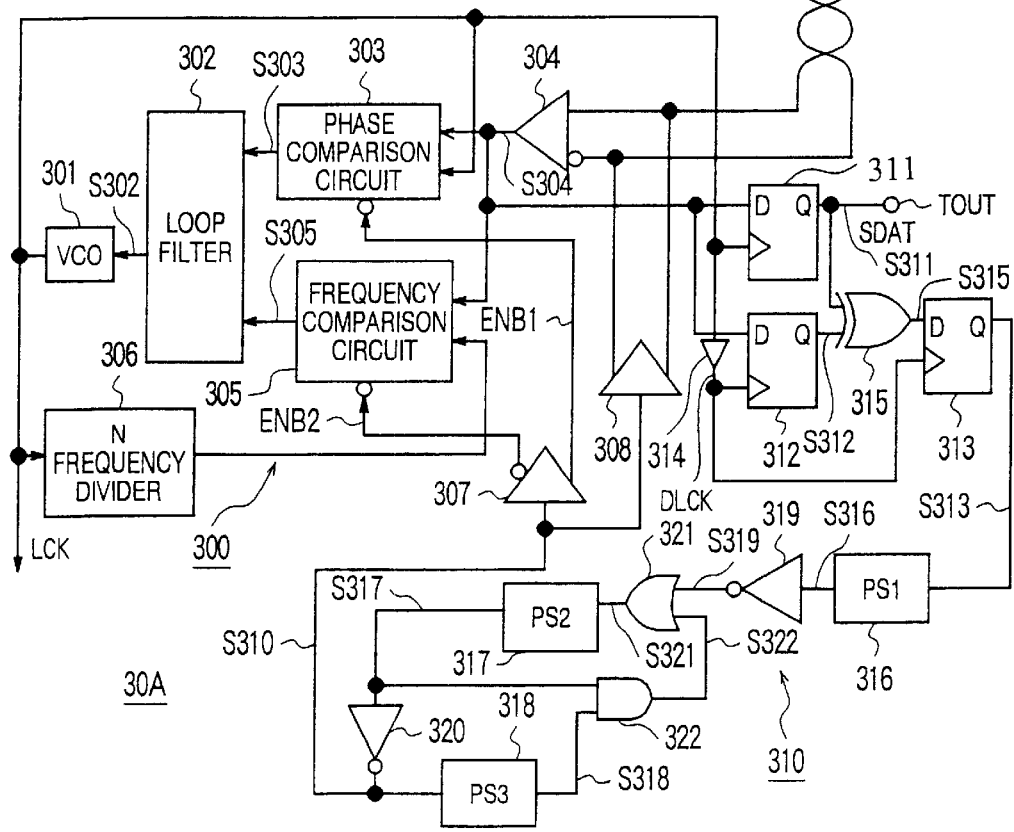

CLOCK REPRODUCTION CIRCUIT AND DATA TRANSMISSION APPARATUS

BACKGROUND OF THE INVENTION

1. Field of the Invention

The present invention relates to a clock reproduction circuit and a data transmission apparatus which can be applied to a serial data transmission apparatus etc. for transmitting serial data at a high speed.

2. Description of the Related Art

Serial data transmission enables transmission of signals by one or a pair of transmission media, therefore is excellent in space saving and does not suffer from the problem of skew (timing deviation) between data occurring when transmitting signals by a signal transmission line having many cores, therefore is suited to long distance data transmission.

FIG. 5 shows a configuration of a general serial data transmission apparatus. The illustrated data transmission apparatus is constituted by a transmission unit 10, a transmission line 20, and a reception unit 30. Further, the transmission unit 10 comprises a parallel/serial conversion circuit 11 and a transmission clock generation circuit 12, while the reception unit 30 comprises a serial/parallel conversion circuit 31 and a clock reproduction circuit 32.

Further, the transmission line 20 is constituted by a pair of signal lines, for example, a shielded twisted pair (STP) or unshielded twisted pair (UTP).

At the time of data transmission, for example, n bits of transmission data input to the transmission unit 10 are converted to serial data in synchronization with a transmission clock signal TCK by the parallel/serial conversion circuit 11 and then output to the transmission line 20.

The transmission clock generation circuit 12 is constituted by for example a PLL circuit, receives a synchronization clock signal CLK, generates a transmission clock signal TCK in accordance with this, and outputs the same to the parallel/serial conversion circuit 11.

The reception unit 30 receives the serial data transmitted through the transmission line 20, converts this to n bits of data by the serial/parallel conversion circuit 31, and then output the same.

The clock reproduction circuit 32 is constituted by for example a PLL circuit, reproduces a reception use clock signal LCK having the same frequency as that of the transmission clock signal TCK based on the transmission data of the transmission line 20, and supplies the same to the serial/parallel conversion circuit.

By the above data transmission apparatus, the transmission data can be transmitted at a high speed by for example a pair of transmission lines, so there is excellent space saving of transmission line. Further, data transmission over a long distance with little distortion of data can be realized.

The data transmission apparatus of the above-mentioned related art has the problem that a circuit for extracting the clock signal from the transmission data per se, that is, the clock reproduction circuit 32, is indispensable for the reception unit 30 to correctly receive the data transmitted from the transmission unit 10.

The clock reproduction circuit 32 can be constituted by a band pass filter having a high Q value or a PLL circuit.

When the clock reproduction circuit 32 is constituted by a band pass filter, generally the differential waveform of the received signal is filtered by a surface acoustic wave (SAW) filter or the like to extract the clock signal. In this method, there is the limitation that this cannot be applied to a transmission rate other than the center frequency of the SAW filter.

When the clock reproduction circuit 32 is constituted by the PLL circuit, control is performed so that the phase of the received signal and the phase of the output of a voltage-controlled oscillator (VCO) become equal and the clock signal is extracted. In this method, there is an advantage that it is possible to handle a variety of data transmission rates if a wide oscillation frequency range of the VCO is taken.

However, when the frequency of the VCO deviates by a large extent from the frequency of the received signal, a phase comparing means, which assumes serial data signals of a random bit train, becomes confused, the VCO drifts in state or becomes locked to a frequency of a whole multiple of the transmission rate, and the transmission clock signal TCK sometimes cannot be correctly extracted.

One method of solving the above problem, is adopted of applying a reference clock signal having a frequency of a specific ratio relative to the rate of the signal to be transmitted to the reception unit 30 and locking the PLL circuit in an initialized state of the reception unit 30. Using this method, however, when the transmission rate of the serial data transmitted by the transmitter is not known, the frequency of the reference clock signal cannot be set, therefore another means of transmitting information concerning the transmission rate becomes necessary.

SUMMARY OF THE INVENTION

The present invention was made in consideration with such a circumstance and has as an object thereof to provide a clock reproduction circuit capable of properly reproducing a clock with a simple circuit structure and a data transmission apparatus which can handle a wide range of transfer rates, has a reproduced clock signal which can quickly track the transmission clock, and does not need to increase the transmission media.

To achieve the above object, according to a first aspect of the present invention, there is provided a clock reproduction circuit comprising a clock generation circuit for generating a clock signal based on input data in synchronization with a basic clock when a switch signal is not input and generating a clock signal locked to the frequency of a reference clock signal based on the reference clock signal generated based on the basic clock when a switch signal is input and an error detection circuit for defining a difference of input data sampled at a plurality of points having different phases of the clock signal generated at the clock generation circuit as the error, detecting whether the error is a chance error or an error due to a deviation of the frequency between the generated clock signal and the input data, and outputting a switch signal to the clock generation circuit in the case of a frequency deviation error.

Further, in the present invention, the clock generation circuit comprises a phase comparison circuit actuated and comparing phases of the generated clock signal and the input data when a switch signal is not input; a frequency comparison circuit actuated and comparing frequencies of the generated clock signal and the reference clock signal when a switch signal is input; and an oscillation controlled circuit oscillating at an oscillation frequency in accordance with a result of comparison of the phase comparison circuit and the frequency comparison circuit to generate the clock signal and outputting the same to the phase comparison circuit, frequency comparison circuit, and error detection circuit.

Further, in the present invention, the error detection circuit comprises an error pulse signal generation circuit for outputting a difference of input data sampled at a plurality of points having different phases of the clock signal generated at the clock generation circuit as an error pulse signal; a first circuit for stretching a pulse width of the error pulse signal by exactly a first time and checking a density of the error; and a second circuit for further stretching a pulse width of the output signal of the first circuit by exactly a second time and outputting a switch signal when there is still a part having a high error density after the stretching by the second time.

Further, in the present invention, the error detection circuit comprises a third circuit for suppressing the output of the switch signal even if there is still a part having the high error density even after stretching the pulse for the second time until the phase of the clock signal is pulled to the phase of the input data when the switch signal is output, the frequency of the clock signal is pulled to the frequency of the reference clock signal to stop the output of the switch signal, and the phase comparison circuit is operated, then the error detection is carried out by the clock signal generated based on the input data.

Further, according to a second aspect of the present invention, there is provided a data transmission apparatus for transmitting transmission data from a transmission unit to a reception unit by a transmission rate set by a transmission clock signal via a transmission line, reproducing a reception use clock signal based on the received signal at the reception unit, and receiving the transmission data, wherein the transmission line comprises a pair of signal lines; the transmission unit comprises an output circuit for converting the transmission data to a pair of differential signals and outputting the same to the transmission line and for outputting a reference clock signal to the transmission line in place of the transmission data when receiving the request signal from the reception unit transmitted through the transmission line; and the reception unit comprises a clock generation circuit for generating a clock signal based on the transmission data when a switch signal is not input and generating a clock signal locked to the frequency of the reference clock signal based on the reference clock signal when a switch signal is input and an error detection circuit for defining the difference of input data sampled at the plurality of points having different phases of the clock signal generated at the clock generation circuit as the error, detecting whether the error is a chance error or an error due to the deviation of the frequency between the generated clock signal and the input data, and outputting a switch signal to the clock generation circuit in the case of frequency deviation error.

Further, in the present invention, the output circuit of the transmission unit comprises a detection circuit for generating a selection control signal in accordance with a signal transmitted to the transmission line and a selection circuit for selecting either of the transmission data or the reference clock signal in accordance with the selection control signal.

Further, in the present invention, the detection circuit outputs a selection control signal for making the selection circuit select and output the transmission data when an in-phase signal is not transmitted to the transmission line and for making the selection circuit select and output the reference clock signal to the selection circuit when an in-phase signal is transmitted to the transmission line.

Further, in the present invention, the output side of the selection circuit is provided with a differential drive circuit for converting the selected signal to differential signals and outputting the same to the transmission line.

Further, in the present invention, the reception unit is provided with a differential reception circuit for outputting a received signal in accordance with differential signals transmitted through the transmission line.

Further, in the present invention, capacitors for blocking the DC component, but passing the AC signal based on the differential signals of the transmission data therethrough are provided between an input terminal of the differential reception circuit and the transmission line.

Further, in the present invention, a bias circuit for setting an operation point of the differential reception circuit is provided.

Further, in the present invention, the clock generation circuit comprises an in-phase drive circuit for outputting an in-phase signal to the transmission line upon receipt of the switch signal.

According to the present invention, in the error detection circuit, the difference of input data sampled at a plurality of points having different phases of the clock signal generated at the clock generation circuit is taken as the error, and it is detected whether this is a chance error or an error due to deviation of the frequency between the generated clock signal and the input data.

In the case of a frequency deviation error, the switch signal is output to the clock generation circuit.

In the clock generation circuit, the clock signal is generated based on the input data in synchronization with the basic clock when a switch signal is not input.

Contrary to this, when an error due to deviation of the frequency between the clock signal and the input data is detected and a switch signal is input, a clock signal locked to the frequency of the related reference clock signal is generated based on the reference clock signal generated based on the basic clock.

Further, according to the present invention, the transmission unit converts the transmission data to differential signals with the transmission rate set by the transmission clock signal and output to the transmission line, while the reception unit reproduces the reception use clock signal in accordance with the received signal and receives the signal from the transmission line in accordance with the reproduced clock signal.

In the reception unit, the reception use clock is reproduced by the clock reproduction circuit. When the frequency of the reproduced clock signal and the frequency of the transmission clock signal for transmission data are different, a switch signal is generated at the error detection circuit and an in-phase request signal for requesting the transmission of the reference clock signal is output to for example the transmission line. Upon receipt of this, the reference clock signal is output to the transmission line by the transmission unit.

In the reception unit, a clock signal locked to the frequency of the related reference clock signal is generated based on the reference clock signal.

When the frequency of the clock signal is pulled to the frequency of the reference clock signal, the usual data communication is carried out. In the clock generation circuit, control is performed so the phase of the clock signal is pulled to the phase of the received data.

BRIEF DESCRIPTION OF THE DRAWINGS

The above object and features of the present invention will be more apparent from the following description of the preferred embodiments given with reference to the accompanying drawings, wherein:

FIG. 1 is a circuit diagram of a first embodiment of a data transmission apparatus according to the present invention;

DESCRIPTION OF THE PREFERRED EMBODIMENTS

Figure 2:
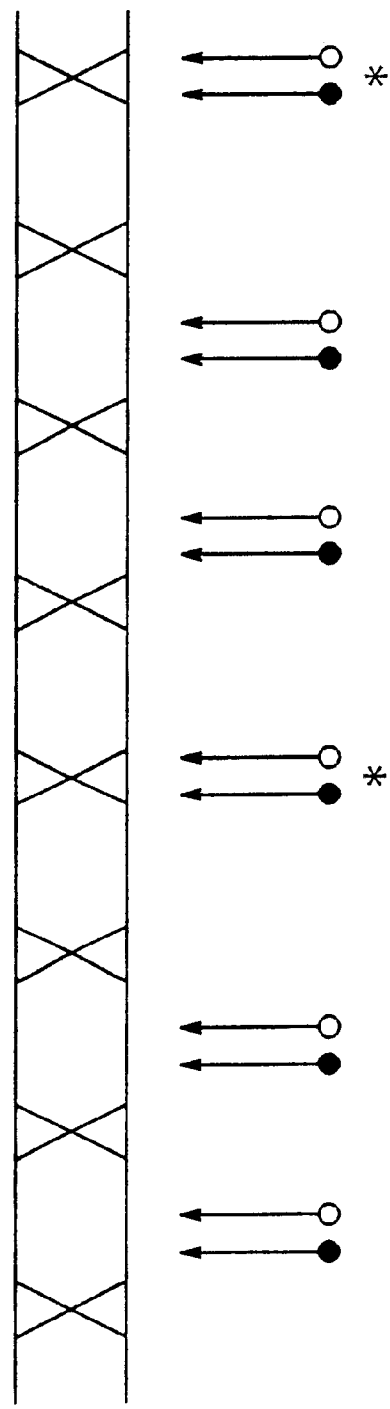
FIG. 2 is a view for explaining a principle of error detection of an error detection circuit according to the present invention.

FIG. 1 is a circuit diagram of an embodiment of a data transmission apparatus according to the present invention.

The data transmission apparatus of FIG. 1 is constituted by a transmission unit 10A having an output circuit 100, a transmission line 20A comprising a pair of signal lines, and a reception unit 30A having a clock generation circuit 300 and an error detection circuit 310.

The output circuit 100 of the transmission unit 10A converts the transmission data, for example, NRZ data, to pairs of differential signals and outputs the same to the transmission line 20A. When receiving a request signal from the reception unit transmitted through the transmission line 20A, it outputs a reference clock signal to the transmission line 20A in place of the transmission data.

The output circuit 100 is specifically constituted by a D-type flip-flop 101, a selector 102, a frequency divider 103, a differential driver 104, a comparator 105, and an in-phase voltage detection circuit 106.

The flip-flop 101 receives as its input a transmission clock signal TCK from a not illustrated transmission clock generation circuit of the transmission unit 10A at its clock signal input terminal, receives as its input the serial transmission data SDAT from a not illustrated parallel/serial conversion circuit at its data input terminal, and sequentially outputs the transmission data SDAT from the output terminal Q to the input terminal 0 of the selector 102 at the timing of the clock signal TCK.

The selector 102 selects the signal input to either of the input terminal 0 or the input terminal 1 in accordance with the level of the selection control signal S105 input to the selection signal terminal S and outputs the same.

When a selection control signal S105 of a high level is input to for example the selection signal terminal S, the selector 102 selects the reference clock signal RCK input to the input terminal 1 and outputs the same.

Contrary to this, when a selection control signal S105 of a low level is input to the selection signal terminal S, the selector 102 selects the transmission data input to the input terminal 0 and outputs the same.

The frequency divider 103 divides the transmission clock signal TCK by N (N is a positive integer) and outputs this frequency-divided signal as the reference clock signal RCK to the input terminal 1 of the selector 102.

The differential driver 104 receives the output signal of the selector 102, generates a pair of differential signals in accordance with this, and outputs the same to the transmission line 20A comprising the pair of signal lines.

The comparator 105 outputs a selection control signal S105 of a high level to the selection signal input terminal S of the selector 102 when the detection signal S106 from the in-phase voltage detection circuit 106 exceeds a predetermined reference voltage $V_{ref}$, and outputs a selection control signal S105 of a low level to the selection signal input terminal S of the selector 102 at times other than this.

The in-phase voltage detection circuit 106 detects the in-phase signal supplied to the transmission line 20A and outputs the detection signal S106 to the comparator 105.

In the output circuit 100 constituted as mentioned above, at the usual operation, only the differential signals are output to the transmission line 20A. Accordingly, a detection signal S106 of a low level is output from the in-phase voltage detection circuit 106.

As a result, a selection control signal S105 of a low level is output from the comparator 105 to the selection signal terminal S of the selector 102. In response to this, the signal input to the input terminal 0 is selected by the selector 102. Namely, the serial transmission data TDT output from the flip-flop 101 is selected by the selector 102 and output to the transmission line 20A.

On the other hand, in the reception unit 30A, when the synchronization of the PLL circuit is lost due to a certain cause, as will be explained later, a request signal of an in-phase signal, that is, the reference clock signal, is generated by the clock generation circuit 300 of the reception unit 30A and output to the transmission line 20A.

In the output circuit 100 of the transmission unit 10A, a detection signal S106 of a high level is generated by the In-phase voltage detection circuit 106 upon receipt of this request signal and output to the comparator 105.

By this, a selection control signal S105 of a high level is output from the comparator 105 to the selection signal terminal S of the selector 102. In response to this, the signal input to the input terminal 1 is selected by the selector 102. Namely, the reference clock signal RCK output from the frequency divider 103 is selected by the selector 102 and output to the transmission line 20A.

The clock generation circuit 300 of the reception unit 30A generates a clock signal LCK based on the transmission data transmitted through the transmission line 20A when it receives a low level switch signal S310 from the error detection circuit 310 and generates a clock signal LCK locked to the frequency of the reference clock signal RCK based on the reference clock signal RCK transmitted through the transmission line 20A when it receives a high level switch signal S310.

The clock generation circuit 300 is constituted by, specifically, a VCO 301, a loop filter 302, a phase comparison circuit 303, a differential receiver 304, a frequency comparison circuit 305, a frequency divider 306, a differential driver 307, and an in-phase driver 308.

Note that the frequency division ratio of the frequency divider 306 is set similar to the frequency division ratio of the frequency division circuit 103 in the transmission unit 10A. Further, both the frequency division ratios of these frequency division circuits can be set to 1. Namely, these frequency dividers can be omitted. By respectively providing the frequency dividers 103 and 306 in the transmission unit 10A and the reception unit 30A, the frequency of the reference clock signal RCK can be reduced, and the operation frequency range of the frequency comparison circuit 305 of the reception unit 30A can be reduced.

The VCO 301 controls the frequency of the clock signal LCK in accordance with the oscillation control signal S302 from the loop filter 302.

The loop filter 302 removes the high frequency component of the oscillation control signal S303 from the phase comparison circuit 303 or the oscillation control signal S305 from the frequency comparison circuit 305, noise, etc. and outputs only the low frequency component as the oscillation control signal S302 to the VCO 301.

The phase comparison circuit 303 compares the phases of the received signal S304 from the differential receiver 304 and the clock signal LCK from the VCO 301, generates the oscillation control signal S303 in accordance with the result of the comparison, and outputs the same to the loop filter 302.

The differential receiver 304 receives the differential signals transmitted through the transmission line 20A to generate the received signal S304 and outputs the same to the phase comparison circuit 303, frequency comparison circuit 305, and error detection circuit 310.

The frequency comparison circuit 305 compares the frequency of the frequency divided signal from the frequency divider 306 and the frequency of the reference clock signal RCK transmitted from the transmission line 20A and outputs the oscillation control signal S305 in accordance with the result of comparison.

Note that the PLL circuit is constituted by the phase comparison circuit 303, frequency comparison circuit 305, loop filter 302, and VCO 301.

In the PLL circuit constituted in this way, the VCO 301 gives a clock signal LCK having a frequency the same as that of the transmission clock signal TCK used in the transmission unit 10. The clock signal LCK is used as the reproduced signal of the transmission clock signal TCK for the reception of the transmission data or the synchronization control of the reception unit 30A.

The phase comparison circuit 303 and the frequency comparison circuit 305 are equipped with an enable function. The operating/nonoperating state is set in accordance with the level of the input enable signal.

Here, both of the phase comparison circuit 303 and the frequency comparison circuit 305 are placed in a low enable state.

Namely, they operate only when a signal of a low level is input to the enable signal input terminal and do not operate at times other than this.

The differential driver 307 receives the switch signal S310 by the error detection circuit 310 and generates enable signals ENB1 and ENB2 for controlling the operating state of the phase comparison circuit 303 and the frequency comparison circuit 305 in accordance with the input level of this switch signal S310.

Specifically, when no error is detected at the error detection circuit 310 and the switch signal S310 is input at a low level, they respectively generate an enable signal ENB1 of a low level and an enable signal ENB2 of a high level.

By this, when no error is detected, only the phase comparison circuit 303 is set in the operating state, and the frequency comparison circuit 305 is set in the nonoperating state.

Contrary to this, in the initialized state or at the usual reception operation, if the frequency of the clock signal LCK generated by the VCO 301 deviates by a large extent from the frequency of the clock signal TCK used in the transmission unit 10A due to a certain cause, detected as an error at the error detection circuit 310, and the switch signal S310 is input at a high level, they respectively generate an enable signal ENB1 of a high level and an enable signal ENB2 of a low level.

By this, when an error is detected, the phase comparison circuit 303 is set in the nonoperating state, and the frequency comparison circuit 305 is set in the operating state.

The in-phase driver 308 receives the switch signal S310 by the error detection circuit 310 to generate the in-phase signal and outputs the same to the transmission line 20A.

The in-phase driver 308 outputs the in-phase signal as the request signal of the reference clock signal to the transmission line 20A at a high level while the switch signal S310 by the error detection circuit 310 is held at a high level.

At this time, the average voltage of a pair of signal lines constituting the transmission line 20A is held at a high level, for example, 1V.

The error detection circuit 310 defines the difference of the input data (or reference clock signals RCK) sampled at two points having different phases of the clock signal LCK generated based on the input NRZ data (or reference clock signal RCK) at the clock generation circuit 300 as the error signal, detects whether this error is a chance error or an error due to the deviation of the frequency between the generated clock signal and the input data, and outputs the switch signal S310 to the differential driver 307 and in-phase driver 308 of the clock generation circuit 300 in the case of the frequency deviation error.

The principle of error detection of the error detection circuit 310 is obtained from the fact that when the deviation of the transmission data, that is, NRZ signal, and the generated clock signal LCK by the VCO 301 is sampled at two points having slight differently phases of the clock signal LCK and the difference is checked, the error pulse output is intermittently obtained (refer to FIG. 2). This is more densely generated in comparison with error due to unlocking etc. occurring by chance in communication. Note that, in FIG. 2, the region indicated by the asterisk is a region where the possibility of generation of error is high.

Therefore, the error detection circuit 310 is constituted so as to generate the difference of input data sampled at two points having different phases of the clock signal LCK generated based on the NRZ data as the error pulse signal, stretch the pulse width of the generated error pulse signal by exactly a predetermined time to check the error density, further stretch the pulse, and detect it as the error if there still exists an error pulse with a certain density.

The error detection circuit 310 is constituted by, specifically, D-type flip-flops 311, 312, and 313, a delay circuit 314, an exclusive OR (EXOR) gate 315, pulse stretchers 316 (PS1), 317 (PS2), and 318 (PS3), inverters 319 and 320, a 2-input OR gate 321, and a 2-input AND gate 322.

The D-type flip-flop 311 inputs the clock signal LCK generated at the clock generation circuit 300 to the clock input, inputs the received signal S304 received at the differential receiver 304 to the input terminal D, samples the received signal S304 by the clock signal LCK, reproduces the transmission data, and outputs the reproduced data S311 from the output terminal Q to an output terminal TOUT and the EXOR gate 315.

The D-type flip-flop 312 inputs a delayed clock signal DLCK obtained by delaying the clock signal LCK generated at the clock generation circuit 300 by exactly a predetermined time at the delay circuit 314 to the clock input, inputs the received signal S304 received at the differential receiver 304 to the input terminal D, samples the received signal S304 by the delayed clock signal LCK, reproduces the transmission data, and outputs the reproduced data S312 from the output terminal Q to the EXOR gate 315.

The D-type flip-flop 313 inputs the delayed clock signal DLCK obtained by delaying the clock signal LCK generated at the clock generation circuit 300 by exactly a predetermined time at the delay circuit 314 to the clock input, inputs a resultant signal S315 of the exclusive OR logic between the reproduced data S311 and S312 sampled at two points having different phases of the clock signal LCK at the EXOR gate 315 to the input terminal D, samples the signal S315 by the delayed clock signal LCK, and outputs the result thereof as the error pulse signal S313 as shown in FIG. 3A from the output terminal Q to the pulse stretcher 316. In FIG. 3A, the waveform of the region indicated by <1> is the error pulse occurring by chance, while the waveform of the region indicated by <2> is the error pulse occurring due to the frequency deviation of the VCO 301.

The error pulse signal generation circuit for generating the error pulse signal of the difference of the input data sampled at two points having different phases of the clock signal LCK generated based on the input data at the clock generation circuit 300 is constituted by these D-type flip-flops 311 to 313, delay circuit 314, and EXOR gate 315.

The pulse stretcher 316 further stretches the pulse width of the error pulse signal S313 by exactly a first time T1 and outputs the same as the signal S316 as shown in FIG. 3B to the inverter 319.

The pulse stretching time T1 in this pulse stretcher 316 is the time for checking the error density as mentioned above.

The inverter 319 inverts the level of the output signal S316 of the pulse stretcher 316 and outputs the signal S319 as shown in FIG. 3C to the OR gate 321.

In the inverted output signal S319 of this inverter 319, since the error pulse signal S313 is stretched by exactly the time T1 at the pulse stretcher 316, as shown in FIG. 3C, the pulse rises at a position where the error is thin in the region indicated by <1>, while the pulse no longer appears at a position where the error is dense as in the region indicated by <2>.

Note that the second circuit is constituted by the pulse stretcher 316 and the inverter 319.

The pulse stretcher 317 further stretches the pulse width of the output signal S321 of the OR gate 321, that is, the output signal S319 of the inverter 319 or the output signal S322 of the AND gate 322, by exactly the second time T2 and outputs the same as the signal S317 as shown in FIG. 3E to the inverter 320 and the AND gate 322.

The output signal S317 of this pulse stretcher 317 is obtained by further stretching the pulse width of the inverted output signal S319 of the inverter 319 by exactly the time T2, therefore, as shown in FIG. 3E, becomes a low level only when the part where the error is dense continues for the time T2 or longer.

The inverter 320 inverts the level of the output signal S317 of the pulse stretcher 317, generates the switch signal S310 as shown in FIG. 3F, and outputs the same to the pulse stretcher 318 and the differential driver 307 and in-phase driver 308 of the clock generation circuit 300.

When this switch signal S310 is output at a high level, as explained above, in the clock generation circuit 300, the operation of pulling the oscillation frequency of the VCO 301 to the frequency of the reference clock signal RCK is carried out with a loop using the frequency comparison circuit 305 by assuming that a frequency deviation has occurred between the clock signal LCK and the input NRZ data.

Note that the second circuit is constituted by the pulse stretcher 317 and the inverter 320.

The pulse stretcher 318 further stretches the pulse width of the switch signal S310 by exactly a third time T3 and outputs the same as the signal S318 as shown in FIG. 3G to the AND gate 322.

The AND gate 322 takes the AND logic between the output signal S317 of the pulse stretcher 317 and the output signal S318 of the pulse stretcher 318 and outputs the result as the mask signal S322 to the OR gate 321.

These pulse stretcher 318 and AND gate 322 have the following functions as the third circuit.

Namely, when the operation of pulling the oscillation frequency of the VCO 301 to the frequency of the reference clock signal RCK with a loop using the frequency comparison circuit 305 carried out at the clock generation circuit 300 is advanced in the period when the switch signal S310 is at a high level, and the oscillation frequency of the VCO 301 approaches the frequency of the reference clock signal RCK, the error pulse signal S313 becomes thin again, the output signal of the pulse stretcher 316 drops to a low level, and the output signal of the pulse stretcher 317 becomes a high level.

As a result, the switch signal S310 becomes a low level, the clock generation circuit 300 operates with a loop using the phase comparison circuit 303, and the operation of pulling the oscillation frequency of the VCO 301 to the input NRZ signal is carried out.

Figure 3:
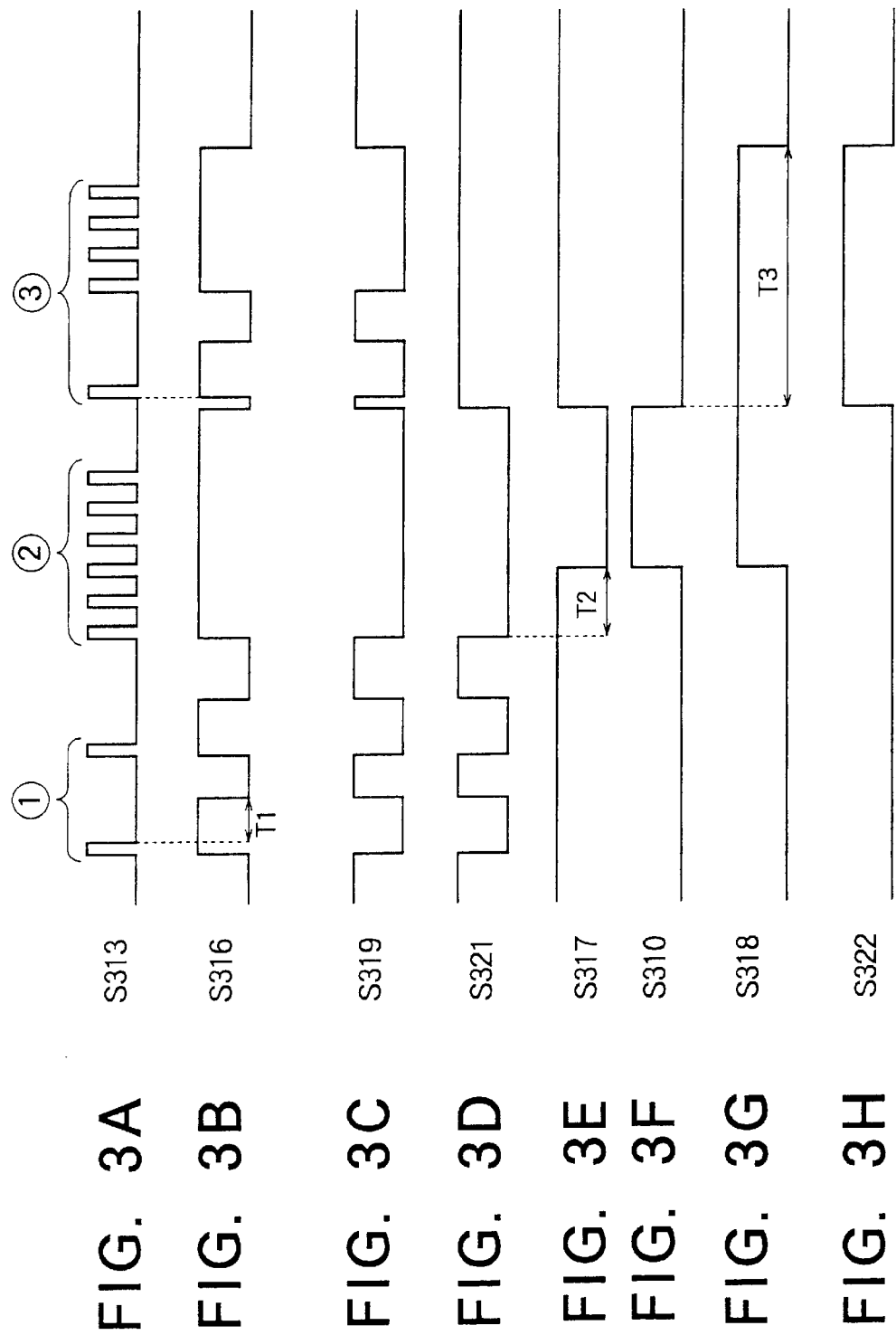
FIGS. 3A to 3H are timing charts for explaining operations of units of the error detection circuit in a reception unit of FIG. 1.

The operation of masking the error of the error pulse signal S313 of the region indicated by <3> in FIG. 3 produced in this pulling step during the time T3 by using the mask signal S322 generated at the pulse stretcher 318 and the AND gate 322, holding the switch signal S310 at a low level, making it operate with a loop using the phase comparison circuit 303, and pulling the phase of the clock signal generated at the VCO 301 to the phase of the input NRZ data is continued.

Next, an explanation will be made of the operation by the above structure.

For example, when the transmission unit 10A and the reception unit 30A are connected via the transmission line 20A, or the frequency of the clock signal LCK generated at the reception unit 30A deviates from the frequency of the transmission clock signal TCK used in the transmission unit 10A due to noise or the like during usual data transmission, the error pulse signal S313 generated at the error signal generation circuit is in the dense state as in the region indicated by <2> of FIG. 3 in an initial stage.

This error signal S313 is stretched in its pulse width by exactly the time T1 at the pulse stretcher 316. As a result, not the pulse, but the signal S316 of the DC-like level is output from the pulse stretcher 316.

This signal S316 is inverted at the inverter 319 and input as the signal S319 of low level via the OR gate 321 to the pulse stretcher 317.

In the pulse stretcher 317, the pulse width of the output signal S321 of the OR gate 321, that is, the output signal S319 of the inverter 319, is further stretched by exactly time T2 and output as the signal S317 shown in FIG. 3E to the inverter 320 and the AND gate 322.

The output signal S317 of this pulse stretcher 317 is obtained by further stretching the pulse width of the inverted output signal S319 of the inverter 319 by exactly the time T2, therefore, as shown in FIG. 3E, it switches to a low level only when the part where the error is dense continues for the time T2 or longer.

Then, in the inverter 320, the level of the output signal S317 of the pulse stretcher 317 is inverted, and the switch signal S310 of a high level is generated and output to the pulse stretcher 318 and the differential driver 307 and in-phase driver 308 of the clock generation circuit 300.

In the differential driver 307, upon receipt of a switch signal S310 of a high level by the error detection circuit 310, the enable signal ENB1 of a high level and the enable signal ENB2 of a low level are generated and are respectively supplied to the phase comparison circuit 303 and the frequency comparison circuit 305.

By this, the phase comparison circuit 303 is set in the nonoperating state, and the frequency comparison circuit 305 is set in the operating state.

Further, in the in-phase driver 308, the in-phase signal is generated upon receipt of the switch signal S310 by the error detection circuit 310 and output to the transmission line 20A.

At this time, the average voltage of the pair of signal lines constituting the transmission line 20A is held at a high level, for example, 1V.

Since the in-phase signal of a high level is output to the transmission line 20A in this way, in the output circuit 100 of the transmission unit 10A, a detection signal S106 of a high level is output by the in-phase voltage detection circuit 106, and a selection control signal S105 of a high level is output to the selector 102 by the comparator 105.

By this, at the selector 102, the reference clock signal RCK from the frequency divider 103 is selected, and the reference clock RCK is output to the transmission line 20A via the differential driver 104.

In the clock generation circuit 300 of the reception unit 30A, the reference clock RCK transmitted through the transmission line 20A is received by the differential receiver 304, and a received signal S304 in synchronization with this is output.

This received signal S304 is input to the frequency comparison circuit 305 set in the operating state by an enable signal ENB2 of a low level.

Further, the frequency-divided signal obtained by dividing the clock signal LCK output by the VCO 301 by N by the frequency divider 306 is input to the frequency comparison circuit 305.

In the frequency comparison circuit 305, the frequencies of the received signal S304 and the frequency divided signal of the frequency divider 306 are compared, and the oscillation control signal S305 is generated in accordance with the result of comparison and output to the loop filter 302. By the loop filter 302, the high frequency component of the oscillation control signal S305 from the frequency comparison circuit 305, noise, etc. are removed, and only the low frequency component is output to the VCO 301.

Then, in the VCO 301, in accordance with the oscillation control signal from the loop filter 302, the frequency of the clock signal LCK is controlled.

Namely, the operation of pulling the oscillation frequency of the VCO 301 to the frequency of the reference clock signal RCK is carried out with a loop using the frequency comparison circuit 305 by assuming that frequency deviation of the clock signal LCK and the input NRZ data and consequently the transmission clock signal TCK used in the transmission unit 10A has occurred.

In this way, the oscillation frequency of the VCO 301 is controlled so that the frequencies of the frequency divided signal from the frequency division circuit 306 and the reference clock RCK coincide, thus the frequency of the clock signal LCK generated by the VCO 301 gradually coincides with the frequency of the transmission clock signal TCK used in the transmission unit 10.

This frequency-adjusted clock signal LCK is input to the error detection circuit 310.

In this case, when the operation of pulling the oscillation frequency of the VCO 301 to the frequency of the reference clock signal RCK with a loop using the frequency comparison circuit 305 to be carried out in the clock generation circuit 300 proceeds while the switch signal S310 is at a high level as mentioned above and the oscillation frequency of the VCO 301 approaches the frequency of the reference clock signal RCK, the error pulse signal S313 generated at the error detection circuit 310 becomes thin again, the output signal of the pulse stretcher 316 drops to a low level, and the output signal of the pulse stretcher 317 switches to a high level.

As a result, the switch signal S310 becomes a low level.

Along with the switch signal S310 becoming low level, in the differential driver 307 of the clock generation circuit 300, upon receipt of a switch signal S310 of a low level by the error detection circuit 310, the enable signal ENB1 is switched to a low level, the enable signal ENB2 is switched to a high level, and they are respectively supplied to the phase comparison circuit 303 and the frequency comparison circuit 305.

By this, the phase comparison circuit 303 switches to the operating state, and the frequency comparison circuit 305 switches to the nonoperating state.

Further, in the in-phase driver 308, the in-phase signal is switched to a low level upon receipt of a switch signal S310 of a low level and is output to the transmission line 20A.

Since the in-phase signal of a low level is output to the transmission line 20A in this way, in the output circuit 100 of the transmission unit 10A, the detection signal S106 of a low level is output by the in-phase voltage detection circuit 106, and a selection control signal S105 of a low level is output to the selector 102 by the comparator 105.

By this, the transmission data from the flip-flop 101, that is, the NRZ data, is selected at the selector 102, and this transmission data is output via the differential driver 104 to the transmission line 20A.

In the clock generation circuit 300 of the reception unit 30A, the NRZ data transmitted through the transmission line 20A is received by the differential receiver 304, and a received signal S104 in synchronization with this is output.

This received signal S104 is input to the phase comparison circuit 303 set in the operating state by the enable signal ENB1 of a low level and the error detection circuit 310.

The clock generation circuit 300 operates with a loop using the phase comparison circuit 303, and an operation of pulling the phase of the clock signal LCK by the VCO 301 to the phase of the input NRZ data is carried out.

Then, in the error detection circuit 310, in this pulling step, the error pulse signal S313 of the region indicate by <3> in FIG. 3 is produced, the mask signal S322 is generated at the pulse stretcher 318 and the AND gate 322, the error is masked for the time T3, and the switch signal S310 is held at a low level.

Namely, the operation of forcibly making the clock generation circuit 300 operate by a loop using the phase comparison circuit 303 and pulling the phase of the clock signal LCK generated at the VCO 301 to the phase of the input NRZ data is continued.

Then, control is carried out so that the phase of the clock signal LCK generated at the VCO 301 with a loop using the phase comparison circuit 303 and the phase of the NRZ data (received signal S304) output from the differential driver 304 coincide with a loop using the phase comparison circuit 303 during the mask period.

Thereafter, the differential signals, that is, the data, is transmitted over the transmission line 20A between the transmission unit 10A and the reception unit 30A.

Further, data SDAT transmitted from the transmission line 20A is sequentially output by the flip-flop 311 in accordance with the timing of the clock signal LCK generated by the VCO 301. The output data SDAT of the flip-flop 311 is converted to for example n bits of data by the not illustrated serial/parallel conversion circuit and then output.

Note that when the frequency of the clock signal TCK deviates from the frequency of the transmission clock signal TCK used in the transmission unit 10A due to noise etc. during the usual data transmission period, the error pulse signal S313 becomes dense in state as in the region indicated by <2> in FIG. 3, and frequency pulling control similar to that mentioned above is carried out.

However, as in the region indicated by <1> in FIG. 3, when the error density is sparse, that is, only so-called chance error can be detected, the signal S317 resulting from the stretching of the pulse width at the pulse stretchers 316 and 317 becomes a DC-like high level signal without a low level period, therefore the switch signal S310 is held at a low level as it is.

Namely, chance error is handled as error which can be solved by continuing the operation of pulling the phase of the clock signal LCK generated at the VCO 301 to the phase of the input NRZ data with a loop using the phase comparison circuit 303.

As explained above, according to the present first embodiment, provision is made of a transmission line 20A comprising a pair of signal lines; a transmission unit 10A having an output circuit 100 which converts the transmission data to a pair of differential signals and outputs the same to the transmission line 20A and outputs a reference clock signal to the transmission line 20A in place of the transmission data when receiving a request signal from the reception unit 30A transmitted through the transmission line; and a reception unit 30A having a clock generation circuit 300 which generates a clock signal based on the transmission data when the switch signal S310 is not input and generates a clock signal locked to the frequency of the related reference clock signal based on the reference clock signal when the switch signal is input and an error detection circuit 310 which defines the difference of input data sampled at a plurality of points having different phases of the clock signal generated at the clock generation circuit 300 as the error, detects whether the related error is chance error or error due to the deviation of the frequency between the generated clock signal and the input data, and outputs a switch signal S310 to the clock generation circuit 300 in the case of the frequency deviation error. Therefore, an effective clock reproduction circuit capable of handling a wide range of transfer rates, capable of quickly locking the PLL circuit to the transmission clock, not requiring an increase of the transmission medium, and capable of accurately reproducing a clock with a simple circuit structure can be realized.

Second Embodiment

Figure 4:
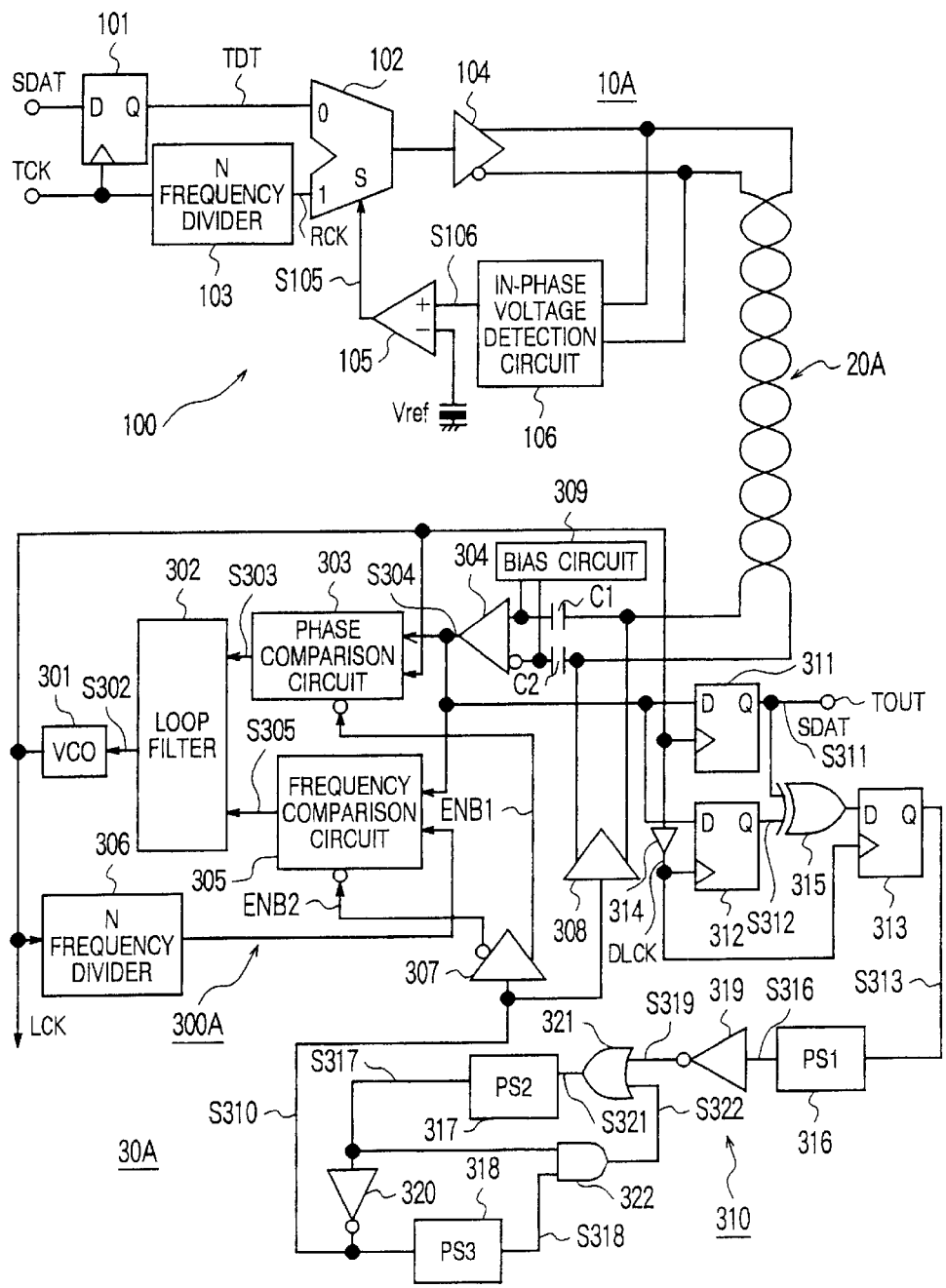
FIG. 4 is a circuit diagram of a second embodiment of the data transmission apparatus according to the present invention.
Figure 5:
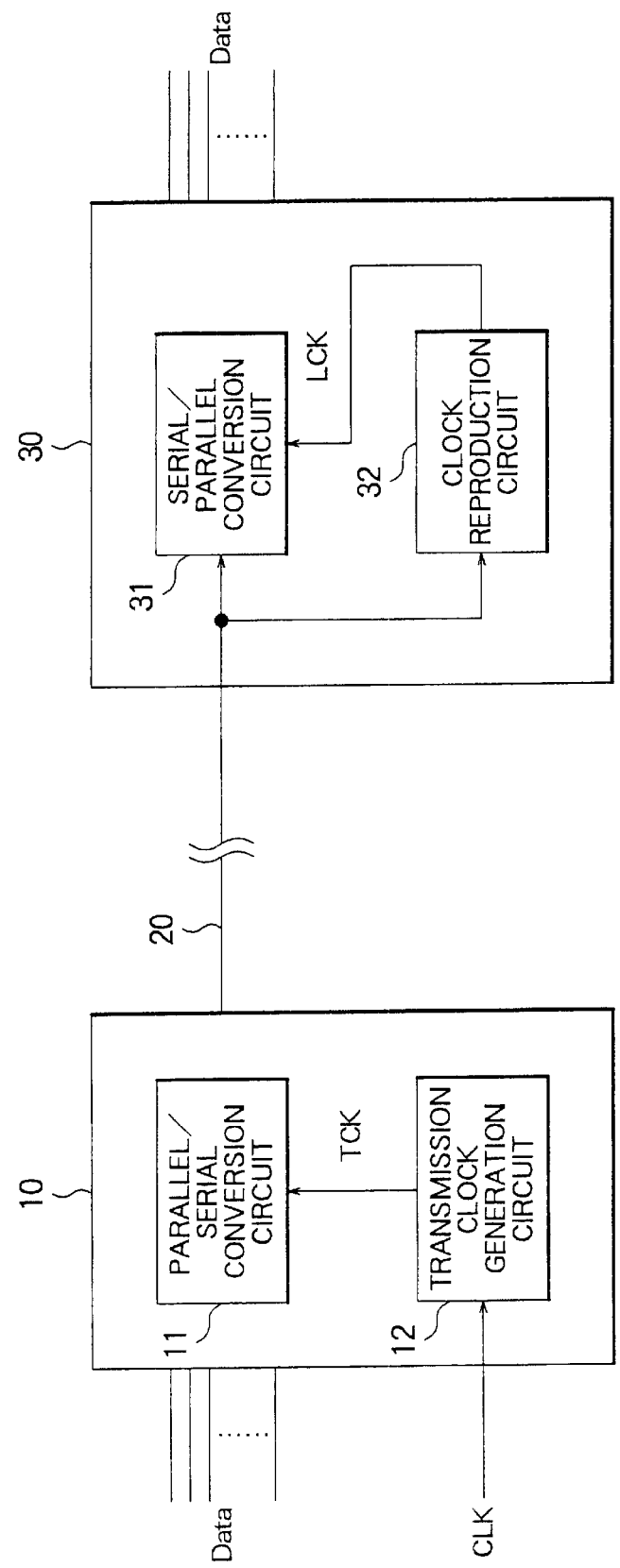
FIG. 5 is a circuit diagram of the configuration of a general serial data transmission apparatus.

FIG. 4 is a circuit diagram of a second embodiment of a data transmission apparatus according to the present invention.

The difference of the second embodiment from the first embodiment of the present invention shown in FIG. 1 resides in that a bias circuit 309 is connected to the input side of the differential receiver 304 in a clock generation circuit 300A of the reception unit 30A and, capacitors C1 and C2 are respectively connected.

The rest of the structure is similar to that of the first embodiment. Constituent parts the same as those of the circuit of FIG. 1 are denoted by the same reference numerals in FIG. 4.

As shown in FIG. 4, the capacitor C1 is connected between the in-phase input terminal of the differential receiver 304 and one signal line of the transmission line 20A, and the capacitor C2 is connected between the inverted input terminal and the other signal line of the transmission line 20A. Further, the bias circuit 309 is connected to the input terminals of the differential receiver 304.

The bias circuit 309 supplies the bias voltage to the differential receiver 304 and sets the operation point of the differential receiver 304.

At the usual data transmission, differential signals in accordance with the transmission data are transmitted to the transmission line 20A at a high speed. The data transmission rate is for example 100 Mb/s to 2 Gb/s. In the reception unit 30A, when the frequency of the clock signal LCK generated by the clock generation circuit 300A deviates from the frequency of the transmission clock signal TCK, the in-phase signal requesting the transmission of the reference clock signal RCK to the transmission line 20A is transmitted to the transmission unit 10A. This in-phase signal is a signal held at a constant level for a predetermined time and can be regarded as a DC signal.

The differential receiver 304 and the transmission line 20A are DC separated by the capacitors C1 and C2. Only the AC component based on the transmission data transmitted from the transmission line 20A is coupled to the differential receiver 304 via the capacitors C1 and C2. Further, when the in-phase reference clock request signal is input to the transmission line 20A, this is blocked by the capacitors C1 and C2 and not input to the differential receiver 304.

In this way, only the differential signal in accordance with the transmission data of the transmission line 20A is input to the differential receiver 304 by the capacitors C1 and C2. The DC component such as the reference clock request signal is blocked. For example, when data is transmitted by using a long transmission line 20A, the transmission unit 10A and the reception unit 30A are driven by respectively independent power sources, and the differential receiver 304 of the reception unit 30A is biased to the optimum operating point in accordance with the power supply voltage given to the differential receiver 304 by the bias circuit 309.

As explained above, according to the second embodiment, in the reception unit 30A, the AC coupling use capacitors C1 and C2 are provided between the input terminal of the differential receiver 304 and the transmission line 20A. Only the high speed differential signals based on the transmission data are input to the differential receiver 304. The DC component is blocked. Therefore, the transmission unit 10A and the reception unit 30A are driven by different power sources, and the differential receiver 304 can set the optimum operating point by the bias circuit 309.

Note that In the first and second embodiments explained above, It is also possible to use a phase comparison circuit in place of the frequency comparison circuit 305 in the clock generation circuits 300 and 300A of the reception unit.

As explained above, according to the present invention, a clock reproduction circuit capable of accurately reproducing a clock can be realized with a simple circuit structure.

Further, a data transmission apparatus capable of handling a wide range of transfer rates, having a reproduced clock signal which can quickly track the transmission clock, and not requiring an increase of the transmission media can be realized.

While the invention has been described by reference to specific embodiments chosen for purposes of illustration, it should be apparent that numerous modifications could be made thereto by those skilled in the art without departing from the basic concept and scope of the invention.

What is claimed is:

1. A clock reproduction circuit, comprising:
   a clock generation circuit for generating a clock signal based on input data in synchronization with a basic clock when a switch signal is not input and generating a clock signal locked to the frequency of a reference clock signal based on the reference clock signal generated based on the basic clock when a switch signal is input and
   an error detection circuit for defining a difference of input data sampled at a plurality of points having different phases of the clock signal generated at the clock generation circuit as the error, detecting whether the error is a chance error or an error due to a deviation of the frequency between the generated clock signal and the input data, and outputting a switch signal to the clock generation circuit in the case of a frequency deviation error.

2. A clock reproduction circuit as set forth in claim 1, where in the clock generation circuit comprises:
   a phase comparison circuit actuated and comparing phases of the generated clock signal and the input data when a switch signal is not input;
   a frequency comparison circuit actuated and comparing frequencies of the generated clock signal and the reference clock signal when a switch signal is input and an oscillation controlled circuit oscillating at an oscillation frequency in accordance with a result of comparison of the phase comparison circuit and the frequency comparison circuit to generate the clock signal and outputting the same to the phase comparison circuit, frequency comparison circuit, and error detection circuit.

3. A clock reproduction circuit as set forth in claim 2, wherein the error detection circuit comprises:
   an error pulse signal generation circuit for outputting a difference of input data sampled at a plurality of points having different phases of the clock signal generated at the clock generation circuit as an error pulse signal;
   a first circuit for stretching a pulse width of the error pulse signal by exactly a first time and checking a density of the error; and
   a second circuit for further stretching a pulse width of the output signal of the first circuit by exactly a second time and outputting a switch signal when there is still a part of said pulse having a high error density after the stretching by the second time.

4. A clock reproduction circuit as set forth in claim 3, wherein said third circuit further comprises suppressing the output of the switch signal even if there is still a part of said pulse having a high error density even after stretching said pulse for the second time until the phase of the clock signal is pulled to the phase of the input data when the switch signal is output, the frequency of the clock signal is pulled to the frequency of the reference clock signal to stop the output of the switch signal, and the phase comparison circuit is operated, wherein the error detection is then carried out by the clock signal generated based on the input data.

5. A clock reproduction circuit as set forth in claim 1, wherein the error detection circuit comprises:
   an error pulse signal generation circuit for outputting a difference of input data sampled at a plurality of points having different phases of the clock signal generated at the clock generation circuit as an error pulse signal; a first circuit for stretching a pulse width of the error pulse signal by exactly a first time and checking a density of the error; and a second circuit for further stretching a pulse width of the output signal of the first circuit by exactly a second time and outputting a switch signal when there is still a part having a high error density after the stretching by the second time.

6. A clock reproduction circuit as set forth in claim 5, wherein the error detection circuit further comprises a third circuit for suppressing the output of the switch signal even if there is still a part of said pulse having a high error density even after stretching said pulse for the second time until the phase of the clock signal is pulled to the phase of the input data when the switch signal is output, the frequency of the clock signal is pulled to the frequency of the reference clock signal to stop the output of the switch signal, and the phase comparison circuit is operated, wherein the error detection is then carried out by the clock signal generated based on the input data.

7. A data transmission apparatus for transmitting transmission data from a transmission unit to a reception unit by a transmission rate set by a transmission clock signal via a transmission line, reproducing a reception use clock signal based on the received signal at the reception unit, and receiving the transmission data, wherein
   the transmission line comprises a pair of signal lines;
   the transmission unit comprises an output circuit for converting the transmission data to a pair of differential signals and outputting the same to the transmission line and for outputting a reference clock signal to the transmission line in place of the transmission data when receiving the request signal from the reception unit transmitted through the transmission line; and
   the reception unit comprises a clock generation circuit for generating a clock signal based on the transmission data when a switch signal is not input and generating a clock signal locked to the frequency of the reference clock signal based on the reference clock signal when a switch signal is input and an error detection circuit for defining the difference of input data sampled at the plurality of points having different phases of the clock signal generated at the clock generation circuit as the error, detecting whether the error is a chance error or an error due to the deviation of the frequency between the generated clock signal and the input data, and outputting a switch signal to the clock generation circuit in the case of frequency deviation error.

8. A data transmission apparatus as set forth in claim 7, wherein the output circuit of the transmission unit comprises:
   a detection circuit for generating a selection control signal in accordance with a signal transmitted to the transmission line and a selection circuit for selecting either of the transmission data or the reference clock signal in accordance with the selection control signal.

9. A data transmission apparatus as set forth in claim 8, wherein the detection circuit outputs a selection control signal for making the selection circuit select and output the transmission data when an in-phase signal is not transmitted to the transmission line and for making the selection circuit select and output the reference clock signal to the selection circuit when an in-phase signal is transmitted to the transmission line.

10. A data transmission apparatus as set forth in claim 9, wherein the clock generation circuit further comprises an in-phase drive circuit receiving the switch signal and outputting an in-phase signal to the transmission line.

11. A data transmission apparatus as set forth in claim 8, further comprising:

a differential drive circuit for converting the selected signal to differential signals and outputting the same to the transmission line at the output side of the selection circuit.

12. A data transmission apparatus as set forth in claim 7, wherein the reception unit comprises a differential reception circuit for outputting a received signal in accordance with differential signals transmitted through the transmission line.

13. A data transmission apparatus as set forth in claim 12, further comprising:

capacitors for blocking the DC component, but passing the AC signal based on the differential signals of the transmission data therethrough connected between an input terminal of the differential reception circuit and the transmission line.

14. A data transmission apparatus as set forth in claim 12, further comprising:

a bias circuit for setting an operation point of the differential reception circuit.

15. A data transmission apparatus as set forth in claim 7, wherein the clock generation circuit comprises:

a phase comparison circuit actuated and comparing phases of the generated clock signal and the input data when a switch signal is not input;

a frequency comparison circuit actuated and comparing frequencies of the generated clock signal and the reference clock signal when a switch signal is input; and an oscillation controlled circuit oscillating at an oscillation frequency in accordance with a result of comparison of the phase comparison circuit and the frequency comparison circuit to generate the clock signal and outputting the same to the phase comparison circuit, frequency comparison circuit, and error detection circuit.

16. A data transmission apparatus as set forth in claim 15, wherein the clock generation circuit further comprises an in-phase drive circuit receiving the switch signal and outputting an in-phase signal to the transmission line.

17. A data transmission apparatus as set forth in claim 1, wherein the error detection circuit comprises:

an error pulse signal generation circuit for outputting a difference of input data sampled at a plurality of points having different phases of the clock signal generated at the clock generation circuit as an error pulse signal;

a first circuit for stretching a pulse width of the error pulse signal by exactly a first time and checking a density of the error; and a second circuit for further stretching a pulse width of the output signal of the first circuit by exactly a second time and outputting a switch signal when there is still a part of said output signal having a high error density after the stretching by the second time.

18. A data transmission apparatus as set forth in claim 17, wherein the error detection circuit comprises a third circuit for suppressing the output of the switch signal even if there is still a part of said output signal having a high error density even after stretching the pulse for the second time until the phase of the clock signal is pulled to the phase of the input data when the switch signal is output, the frequency of the clock signal is pulled to the frequency of the reference clock signal to stop the output of the switch signal, and the phase comparison circuit is operated, then the error detection is carried out by the clock signal generated based on the input data.

19. A data transmission apparatus as set forth in claim 7, wherein the error detection circuit comprises:

an error pulse signal generation circuit for outputting a difference of input data sampled at a plurality of points having different phases of the clock signal generated at the clock generation circuit as an error pulse signal;

a first circuit for stretching a pulse width of the error pulse signal by exactly a first time and checking a density of the error; and a second circuit for further stretching a pulse width of the output signal of the first circuit by exactly a second time and outputting a switch signal when there is still a part of said output signal having a high error density after the stretching by the second time.

20. A data transmission apparatus as set forth in claim 19, wherein the error detection circuit comprises a third circuit for suppressing the output of the switch signal even if there is still a part of said output signal having a high error density even after stretching the pulse for the second time until the phase of the clock signal is pulled to the phase of the input data when the switch signal is output, the frequency of the clock signal is pulled to the frequency of the reference clock signal to stop the output of the switch signal, and the phase comparison circuit is operated, then the error detection is carried out by the clock signal generated based on the input data.

21. A data transmission apparatus as set forth in claim 19, wherein the clock generation circuit further comprises an in-phase drive circuit receiving the switch signal and outputting an in-phase signal to the transmission line.

22. A data transmission apparatus as set forth in claim 7, wherein the clock generation circuit further comprises an in-phase drive circuit receiving the switch signal and outputting an in-phase signal to the transmission line.

* * * * *